United States Patent [19]

Sheng

[11] Patent Number: 5,304,537
[45] Date of Patent: Apr. 19, 1994

[54] M-TL-BA-CU-O HIGH TEMPERATURE SUPERCONDUCTORS WHEREIN M IS SELECTED FROM THE GROUP CONSISTING OF TI, ZR AND HF

[75] Inventor: Zhengzhi Sheng, Fayetteville, Ark.

[73] Assignee: The University of Arkansas, Little Rock, Ark.

[21] Appl. No.: 836,378

[22] Filed: Feb. 18, 1992

[51] Int. Cl.[5] .................... C01G 3/02; C01G 15/00; H01B 1/08; H01L 39/12
[52] U.S. Cl. .................... 505/120; 252/518; 252/521; 505/783
[58] Field of Search ............ 505/1, 783, 785; 252/518, 521

[56] References Cited

U.S. PATENT DOCUMENTS 5,217,949 6/1993 Liu .......................... 505/783

FOREIGN PATENT DOCUMENTS 0356231 2/1990 European Pat. Off. ............ 505/783
0308803 12/1989 Japan ............................ 505/783
2244268 11/1991 United Kingdom .

OTHER PUBLICATIONS

Sheng "Superconductivity in the rare earth free Tl-Ba-Cu-O . . . " *Nature* v. 332 Mar. 3, 1988 pp. 55-58.
Nakajima "Over doping of $Tl_2Ba_2CuO_6$ . . . " *Physica C* v. 160 1989 pp. 458-460.
Hsu "Photoemission search for an RVB state . . . " *American Institute of Physics* 1990 pp. 49-52.

*Primary Examiner*—Paul Lieberman
*Assistant Examiner*—John Boyd
*Attorney, Agent, or Firm*—Hermann Ivester

[57] ABSTRACT

A high-temperature superconducting system comprising M-Tl-Ba-Cu-O wherein: M is selected from the group consisting of Ti, Zr, and Hf. In one embodiment, the M-Tl-Ba-Cu-O system forms a high Tc phase of approximately 90 K wherein: M is selected from the group consisting of Zr and Hf. In another embodiment, a nominal $ZrTl_2Ba_2Cu_3O_{10}$ sample forms a high Tc phase of above 100 K.

5 Claims, 2 Drawing Sheets

M-TL-BA-CU-O HIGH TEMPERATURE SUPERCONDUCTORS WHEREIN M IS SELECTED FROM THE GROUP CONSISTING OF TI, ZR AND HF

BACKGROUND OF THE INVENTION

The present invention relates to high temperature superconductor systems and processes for making same.

A variety of superconducting systems have been created. In particular, several systems are based on thallium (Tl), including Tl-Ba-Cu-O, Tl-Sr-Ba-Cu-O, and Tl-Ca-Ba-Cu-O. For example, U.S. patent application Ser. No. 144,114, filed on Jan. 15, 1988 in the names of Z. Z. Sheng and A. M. Hermann, discloses Tl-Ba-Cu-O superconductor systems and processes for making them. This 90 K system is the first non-rare earth superconducting system above liquid nitrogen temperature.

In addition, U.S. patent application Ser. No. 155,247, filed on Feb. 12, 1988 in the names of Sheng and Hermann, discloses Tl-Ca-Ba-Cu-O and Tl-Sr-Ba-Cu-O superconductor systems and processes of making same. The addition of Ca into the Tl-Ba-Cu-O system resulted in superconductivity in excess of 120 K, the highest reproducible Tc to date.

Although superconducting systems disclosed in the above-identified patent applications have produced high-temperature superconductors and processes for making same, new systems are desirable for several reasons. A new superconducting system could:

1) Facilitate the discovery of the correct theory on oxide superconductivity;
2) Extend the framework of the search for higher-temperature superconductors; and
3) Provide low cost processing and manufacturability.

SUMMARY OF THE INVENTION

The present invention provides a composition having superconductive properties comprising M-Tl-Ba-Cu-O, wherein M is selected from the group consisting of Ti, Zr, and Hf.

In an embodiment, the present invention provides a composition having superconductive properties at a temperature of approximately 90 K, comprising M-Tl-Ba-Cu-O, wherein: M is selected from the group consisting of Ti, Zr, and Hf.

In another embodiment, the invention provides a material having superconductive properties having the nominal composition Ti-Tl-Ba-Cu-O.

In an embodiment, the invention provides a material having superconductive properties having the nominal composition Zr-Tl-Ba-Cu-O.

In another embodiment, the invention provides a material having superconducting properties having the nominal composition Hf-Tl-Ba-Cu-O.

In an embodiment, the invention provides a superconducting compound having a superconducting phase with the composition $HfTl_2Ba_2CuO_6$ with lattice parameters of $a=3.893$ Å and $c=23.212$ Å.

In a further embodiment, the invention provides a superconducting compound having a superconducting phase with the composition $ZrTl_2Ba_2CuO_6$ with lattice parameters of $a=3.874$ Å and $c=23.199$ Å.

In a further embodiment of the present invention, a method is provided for preparing the high-temperature superconductors. The method comprises the steps of: mixing together $Tl_2O_3$, $BaO_2$, CuO and $MO_2$, wherein M is chosen from the group consisting of Ti, Hf, and Zr, heating the mixture, and cooling it.

In another embodiment, the mixture is heated at a temperature of approximately 900° C. to about 950° C. for about 3 to 5 minutes in flowing oxygen.

Additional features and advantages of the present invention are further described, and will be apparent from a detailed description of the presently preferred embodiments and from the drawings.

DETAILED DESCRIPTION OF THE PRESENTLY PREFERRED EMBODIMENTS

Figure 1:
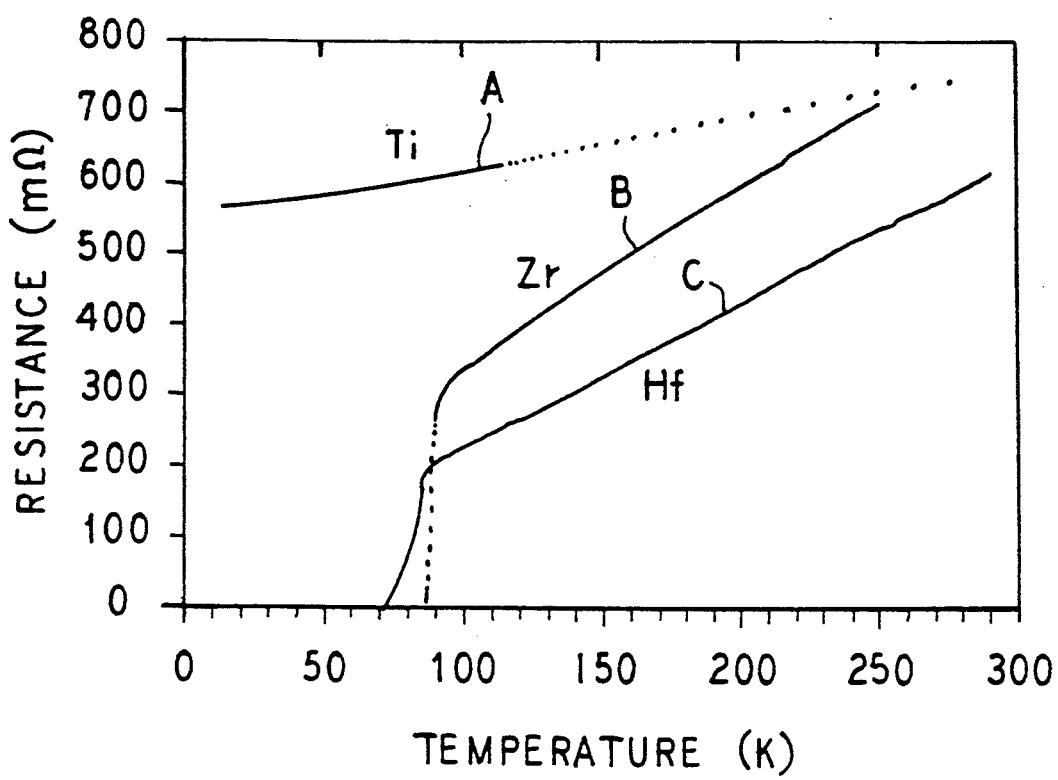
FIG. 1 illustrates resistance versus temperature for a nominal $TiTl_2Ba_2Cu_3O_{10}$ sample, a nominal $ZrTl_2Ba_2Cu_3O_{10}$ sample, and a nominal $HfTl_2Ba_2Cu_3O_{10}$ sample.

The present invention provides high-temperature superconductors and the processes for making them. To this end, the present invention provides a composition having superconductor properties comprising: M-Tl-Ba-Cu-O wherein: M is selected from the group consisting of Ti, Zr and Hf.

The inventor of the present invention has observed that elemental dopings with Zr or Hf in a Tl-Ba-Cu-O system results in a compound with a higher Tc. In particular, Zr- and Hf- doping produced a 90 K superconducting phase. Further, the Zr-Tl-Ba-Cu-O system formed several superconducting phases, one having a Tc above 100 K. This is the first observation of superconductivity above 100 K in a Ca-free system.

The present invention further provides methods for preparing high-temperature superconductors. Typically, samples are prepared by mixing components together and heating the mixture in flowing oxygen. For example, $Tl_2O_3$, $BaO_2$, CuO, and $MO_2$ are mixed together to achieve the desired composition, wherein M is selected from the group consisting of Ti, Zr, and Hf.

In an embodiment of the method, the components are mixed, ground, and pressed into a pellet having a diameter of 7 mm and a thickness of 1-2 mm. The pellet is then heated in a tube furnace to approximately 900°-950° C. for about 3 to 5 minutes. The pellet is removed from the furnace and cooled in air to room temperature.

Resistance (ac, 27 Hz) was measured by a standard four-probe technique with silver paste contacts, and ac (27 or 500 Hz) susceptibility was measured using the induction technique. All measurements were performed in a commercial ADP closed-cycle refrigerator with computer control and processing. Further, powder x-ray diffraction studies were conducted with Cu Kα radiation with the use of a DIANO DTM 1057 diffractometer.

By way of example, and not limitation, examples of the superconducting compositions and processes for making them are described below.

EXAMPLE 1

A nominal $TiTl_2Ba_2Cu_3O_{10}$ sample (designated "A"), a nominal $ZrTl_2Ba_2Cu_3O_{10}$ sample (designated "B"), and a nominal $HfTl_2Ba_2Cu_3O_{10}$ sample (designated "C") were prepared according to the following methods.

Sample A was prepared by mixing together appropriate amounts of $Tl_2O_3$, $BaO_2$, $CuO$, and $TiO_2$. The mixture was ground and pressed into a pellet with a diameter of 7 mm and a thickness of 1–2 mm. The pellet was heated in a tube furnace at approximately 900° C. to about 950° C. for about 3 to 5 minutes in flowing oxygen. The pellet was then air cooled to room temperature. The pellet had a nominal composition of $TiTl_2Ba_2Cu_3O_{10}$.

For Sample B, appropriate amounts of $Tl_2O_3$, $BaO_2$, $CuO$, and $ZrO_2$ were mixed, ground, and pressed into a pellet with a diameter of 7 mm and a thickness of 1–2 mm. The pellet had a nominal composition of $ZrTl_2Ba_2Cu_3O_{10}$. The pellet was heated in a tube furnace for about 3 to 5 minutes in flowing oxygen at approximately 900° C. to about 950° C. Further, the pellet was air cooled to room temperature. The resulting product exhibited superconducting properties.

In preparing Sample c, appropriate amounts of $Tl_2O_3$, $BaO_2$, $CuO$ and $HfO_2$ were mixed, ground, and pressed into a pellet having a diameter of 7 mm and a thickness of 1–2 mm. The pellet had a nominal composition of $HfTl_2Ba_2Cu_3O_{10}$. Next, the pellet was heated in a tube furnace at approximately 900° C. to about 950° C. for about 3 to 5 minutes in flowing oxygen. The pellet was then air cooled to room temperature. The resulting product was super conducting.

The resistant-temperature dependencies for Samples A, B, and C were determined, and are illustrated in FIG. 1. The onset, mid-point, and zero resistant temperatures for Sample B are 92, 88, and 86 K, and 88, 80, and 70 K for Sample C, respectively. FIG. 1 further illustrates that Sample A is not superconducting as low as 15 K. These results indicate that the superconducting properties of the M-Tl-Ba-Cu-O samples can be enhanced by optimizing the initial composition of the samples.

Figure 2:
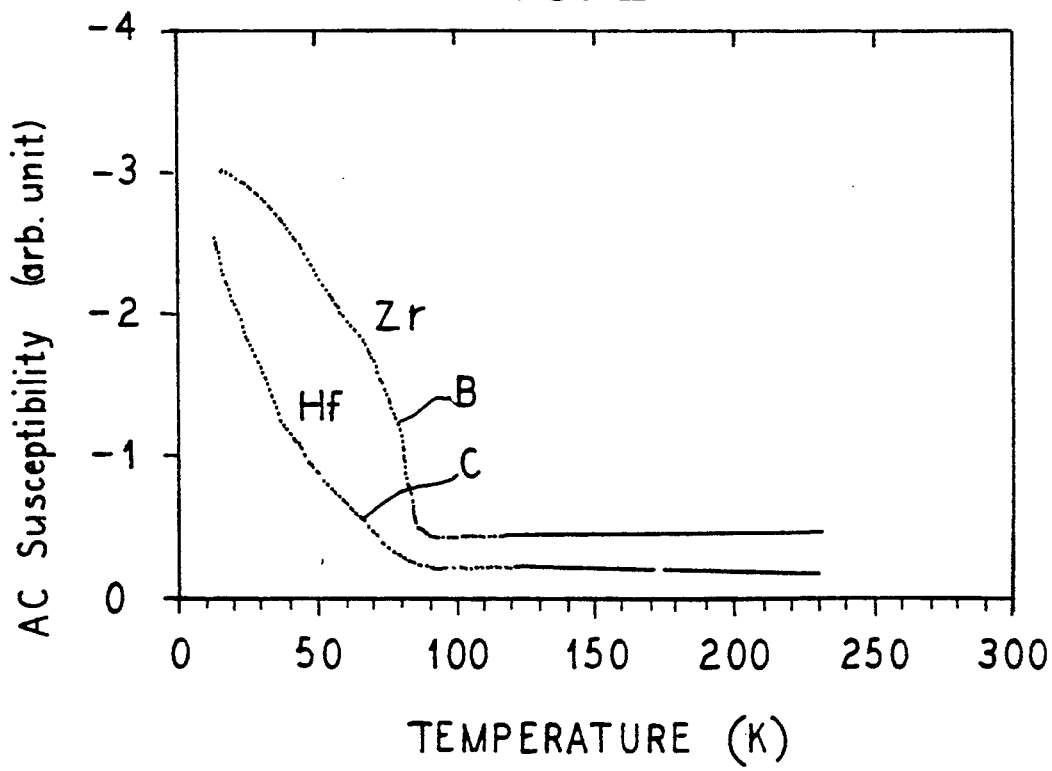
FIG. 2 illustrates AC susceptibility versus temperature for a nominal $ZrTl_2Ba_2Cu_3O_{10}$ sample and a nominal $HfTl_2Ba_2Cu_3O_{10}$ sample.

In FIG. 2, ac susceptibility-temperature dependencies are shown for Samples B and C. The onset temperature of diamagnetism is 90 K for Sample B and 86 K for Sample C. These results are consistent with the transition temperatures as determined by the resistance measurements.

EXAMPLE 2

The superconducting behaviors of the nominal $ZrTl_2Ba_2Cu_3O_{10}$ and $HfTl_2Ba_2Cu_3O_{10}$ samples are sensitive to the preparation conditions. Preparation conditions that resulted in a melted and solidified sample having a shining surface produced the best superconductors. This can be achieved by carefully controlling the preparation conductions. At some preparation conditions, ZrTlBaCuO samples can form several superconducting phases.

Figure 3:
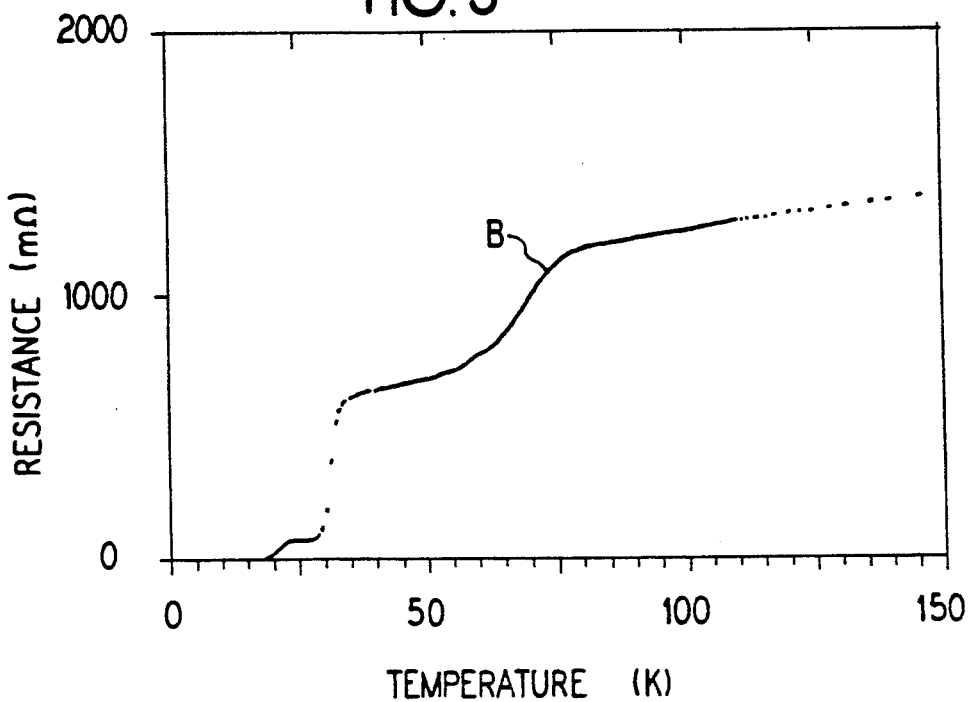
FIG. 3 illustrates resistance versus temperature for a nominal $ZrTl_2Ba_2Cu_3O_{10}$ sample.

FIG. 3 illustrates the resistance-temperature dependence for a nominal $ZrTl_2Ba_2Cu_3O_{10}$ sample (B). Sample B contains three superconducting phases with transition temperatures at approximately 22, 35 and 80 K, respectively. In particular, the inventor of the present invention observed superconductivity above 100 K in one nominal Zr sample. This is the first observation of a Tc above 100 K in a Ca-free system.

Figure 4:
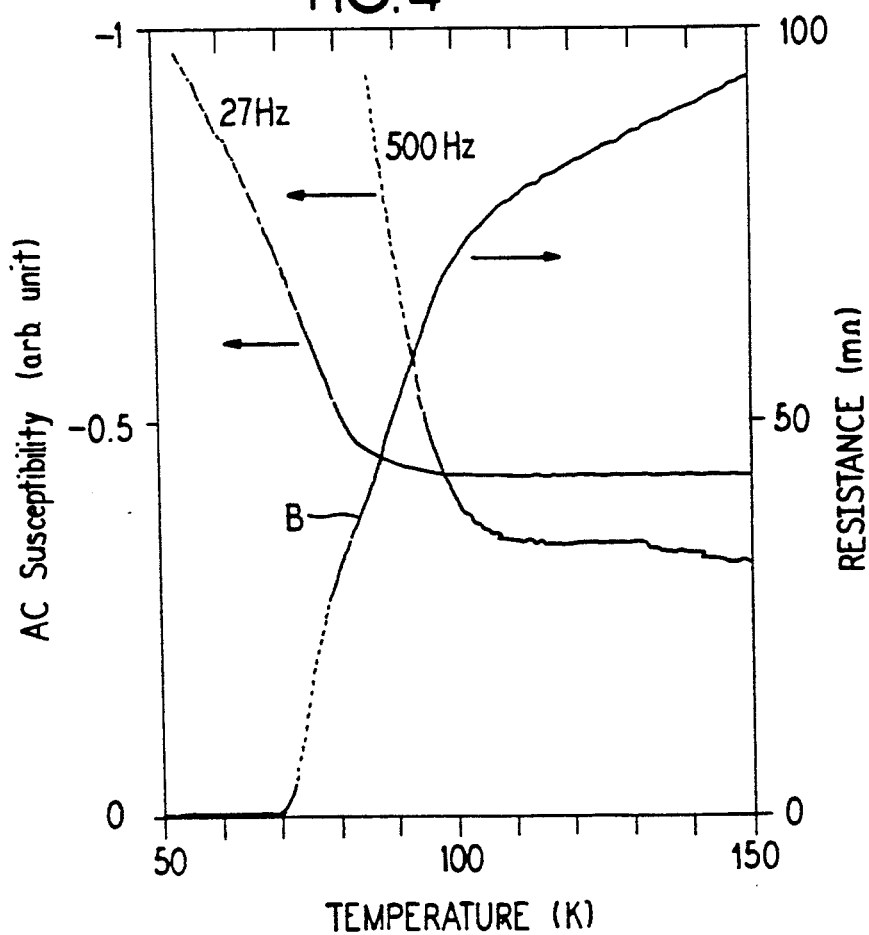
FIG. 4 illustrates resistance and AC susceptibility versus temperature for a nominal $ZrTl_2Ba_2Cu_3O_{10}$ sample.

The resistance and ac susceptibility versus temperature for this Zr sample is illustrated in FIG. 4. The inventor believes that because of the ability of the Zr-Tl-Ba-Cu-O system to form superconducting compounds, improved initial compositions and/or preparation conditions can lead to even higher-temperature superconductors.

EXAMPLE 3

Powder x-ray diffraction analyses were performed on the nominal $TiTl_2Ba_2Cu_3O_{10}$, $ZrTl_2Ba_2Cu_3O_{10}$, and $HfTl_2Ba_2Cu_3O_{10}$ samples. The Zr and Hf samples contained a main phase with a structure similar to $Tl_2Ba_2CuO_6$, while the Ti sample did not contain such a phase. These results suggest that the $Tl_2Ba_2CuO_6$-like phase is responsible for the 90 K superconductivity as observed in the Zr and Hf samples.

According to the powder diffraction patterns, the phase in the Zr sample can be indexed to a tetragonal unit cell with $a=3.874$ Å and $c=23.199$ Å. The phase in the Hf sample can also be indexed to a tetragonal unit cell with $a=3.893$ Å and $c=23.212$ Å. Further, since the lattice parameters of the $Tl_2Ba_2CuO_6$-like phase in the Zr and Hf samples are significantly different from those of the $Tl_2Ba_2CuO_6$ phase ($a=3.866$ Å, and $c=23.239$ Å), the inventor believes that Zr and Hf has entered the crystalline lattice structure of the superconducting phase.

It should be understood that various changes and modifications to the presently preferred embodiments described herein will be apparent to those skilled in the art. Such changes and modifications can be made without departing from the spirit and scope of the present invention and without diminishing its attendant advantages. Therefore, it is intended that such changes and modifications be covered by the appended claims.

We claim:

1. A superconducting compound having a phase with the approximate composition $ZrTl_2Ba_2CuO_6$ and a tetragonal unit cell with lattice parameters of $a=3.874$ Å and $c=23.199$ Å, wherein said composition has a $T_c$ of at least approximately 90 K.

2. A superconducting compound having a phase with the approximate composition $HfTl_2Ba_2CuO_6$ and a tetragonal unit cell with lattice parameters of $a=3.893$ Å and $c=23.212$ Å, wherein said composition has a $T_c$ of at least approximately 90 K.

3. A superconducting composition having the nominal composition $TiTl_2Ba_2Cu_3O_{10}$.

4. A superconducting composition having the nominal composition $ZrTl_2Ba_2Cu_3O_{10}$, wherein said composition has a $T_c$ of at least approximately 90 K.

5. A superconducting composition having the nominal composition $HfTl_2Ba_2Cu_3O_{10}$, wherein said composition has a $T_c$ of at least approximately 90 K.

* * * * *